United States Patent [19]
Napierala

[11] Patent Number: 5,953,213
[45] Date of Patent: Sep. 14, 1999

[54] MULTICHIP MODULE

[75] Inventor: Dieter Napierala, Hildesheim, Germany

[73] Assignee: Robert Bosch GmbH, Stuttgart, Germany

[21] Appl. No.: 09/051,372

[22] PCT Filed: Apr. 26, 1997

[86] PCT No.: PCT/DE97/00856

§ 371 Date: Apr. 8, 1998

§ 102(e) Date: Apr. 8, 1998

[87] PCT Pub. No.: WO98/07193

PCT Pub. Date: Feb. 19, 1998

[30] Foreign Application Priority Data

Aug. 9, 1996 [DE] Germany ............................ 196 32 200

[51] Int. Cl.[6] ....................................................... H05K 7/02
[52] U.S. Cl. ........................ 361/760; 361/763; 361/764; 361/765; 361/766; 361/772; 361/782; 361/783; 257/692; 257/723; 257/724; 257/700; 257/734; 257/737; 174/52.1; 174/52.4
[58] Field of Search ........................... 361/760, 762–767, 361/772, 776, 778, 782, 783; 257/686, 692, 93, 698, 700, 704, 723, 724, 734, 737, 738; 439/69; 174/52.1, 52.4

[56] References Cited

U.S. PATENT DOCUMENTS

| | | | |
|---|---|---|---|
| 4,827,328 | 5/1989 | Ozawa et al. ............................ | 361/765 |
| 5,239,198 | 8/1993 | Lin et al. .................................. | 257/693 |
| 5,319,243 | 6/1994 | Leicht et al. ............................. | 257/692 |
| 5,428,885 | 7/1995 | Minoru et al. . | |
| 5,490,324 | 2/1996 | Newman ................................... | 29/830 |
| 5,562,837 | 10/1996 | De Givry Jacques . | |
| 5,729,438 | 3/1998 | Pieper et al. ............................. | 361/760 |
| 5,751,555 | 5/1998 | Pfizenmayer et al. ................... | 361/763 |

FOREIGN PATENT DOCUMENTS

| | | |
|---|---|---|
| 171 662 | 2/1986 | European Pat. Off. . |
| 282 396 | 9/1988 | European Pat. Off. . |
| 675 539 | 10/1995 | European Pat. Off. . |
| 720 232 | 7/1996 | European Pat. Off. . |
| 8-088474 | 4/1996 | Japan . |
| 95 08189 | 3/1995 | WIPO . |

OTHER PUBLICATIONS

IBM Technical Disclosure Bulletin, Bd. 23, Nr. 3, Aug. 1980, New York Iafrate et al, "Integrated Circuit Wafer Package".
IEICE Transactions, Bd. E74, Nr. 8, Aug. 1, 1991 Umezawa et al., "Gaas Multichip Package for Supercomputer".
IEEE Transactions on Components, Hybrids, and Manufacturing Technology, Bd. CHMT–7, Nr. 2, New York, Jun., 1984 Sppielberger et al., "Silicon–on–Silicon Packaging".
Proceedings of the Multi Chip Module Conference (MCMC), Santa Cruz, Mar. 18–20, 1992 Nr. Conf. 1, Mar. 18, 1992, Institute of Electrical and Electronics Engineers Toshio Sudo, "Silicon–on–Silicon Technology for cmos–Based Computer Systems".

*Primary Examiner*—Leo P. Picard
*Assistant Examiner*—David Foster
*Attorney, Agent, or Firm*—Kenyon & Kenyon

[57] ABSTRACT

A multichip module having a carrier substrate, on whose component side an IC component and other electronic components are mounted which are interconnected by way of electrically conductive interconnects. Electrical through-lines are led from the component side to the bottom side of the carrier substrate and being joined to solder contacts arranged on the bottom side for the electrical connection of the multichip module to a card cage. To reduce the density of printed circuit traces on the top side of the multichip module, and to decrease the number of layers necessary in the carrier substrate, a carrier part is arranged between an IC component and the carrier substrate, the carrier part having printed circuit traces and components which are connected to the respective IC component by way of first terminal pads, and are connected to terminals on the carrier substrate by way of second terminal pads.

8 Claims, 1 Drawing Sheet

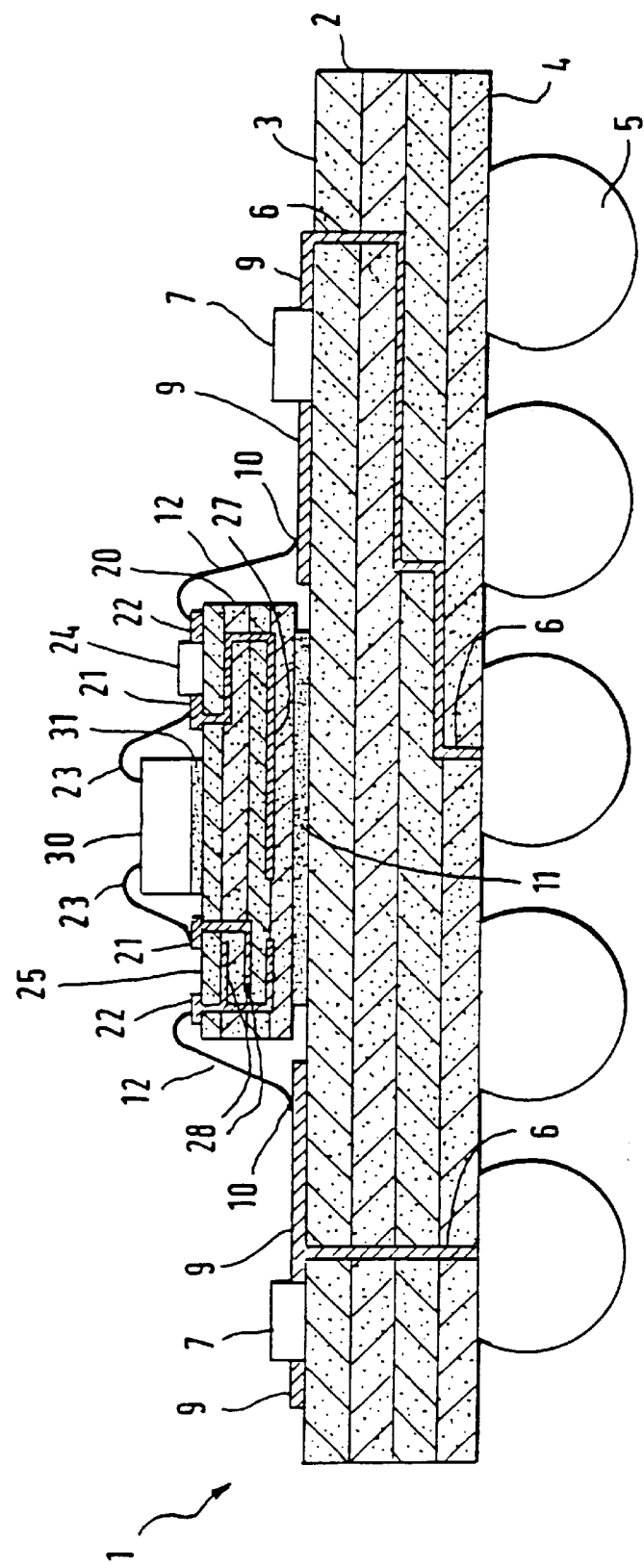

MULTICHIP MODULE

BACKGROUND INFORMATION

Multichip modules are made of a carrier substrate, upon which are mounted a plurality of housing-less IC components and other electronic components such as SMD (surface-mounted device) components. A cover or cap is placed on the carrier substrate to protect the sensitive components from environmental influences. As a rule, the carrier substrate is formed as a multilayer printed circuit board or multilayer ceramic, so that the IC components and the other electronic components can be interconnected by way of several layers of the carrier substrate. The electrical connections of the multichip module are connected by way of vias to solder contacts provided on the bottom side of the carrier substrate which are advantageously shaped in the form of "solder bumps", and are used for the mechanical and electrical connection of the multichip module to correspondingly aligned bonding pads of a card cage. The IC components mounted on the top side of the multichip module, provided as the component side, have a plurality of connecting terminals which are connected to printed circuit traces on the top side of the multichip module. For this purpose, the IC components are pasted or mounted in another suitable manner on the top side of the module and are connected by way of bonding wires to terminal connections integrated in the printed circuit traces. To suppress the transmission of electromagnetic interference, it is further known to connect discrete resistors to the individual connecting circuit traces of an IC-component that are joined to the bonding wires. These resistors must be placed on the multichip module outside of the area needed for mounting the respective IC component. A disadvantage of the previous related art is that the surface of the multichip module needed for mounting the IC component must be larger than the base area of the IC component, in order to avoid damage to the circuit elements and individual components on the top side of the module when mounting the IC. Since printed circuit traces and components such as resistors cannot be provided on this surface, it is necessary to enlarge the top surface of the multichip module accordingly, in order to be able to mount all requisite components and printed circuit traces on the top side. Given a multichip module having a plurality of IC's, each and every one of which has numerous connecting terminals which must be connected to interference-suppression resistors, the surface requirement on the top side of the multichip module increases considerably. This has a negative effect on production costs and the size of the module. Furthermore, it is a disadvantage that the discrete resistor components, provided for suppressing interference signals, and their electrical interface connections on the component side of the multichip module take up a relatively great deal of space. It is particularly disadvantageous that the multitude of electrical connections of an IC component to the resistors provided for interference suppression necessitates an increase in the number of layers in the carrier substrate. This, in turn, complicates the design of the circuit-trace layout, disadvantageously affecting the production costs.

SUMMARY OF THE INVENTION

The multichip module of the present invention provides that between each IC component and the carrier substrate. The multichip module of the present invention provides that between each IC component and the carrier substrate of the module, a carrier part is provided upon which components and portions of the circuit-trace wiring can be applied. Since the carrier part can be produced independently of the manufacturing method for the carrier substrate, the selection of suitable manufacturing methods makes it possible to provide finer circuit-trace structures and smaller-dimensioned components on the carrier part. Due to this, both the space requirement on the top side of the carrier substrate and the number of layers necessary in the carrier substrate can be reduced, making it possible to lower production costs of the module.

According to the present invention, the base area of the carrier part is to larger than the base area of the corresponding IC component. The first and second terminal pads for the components and printed circuit traces provided on the carrier part can then be applied in a space-saving manner on the portion of the carrier part not covered by the IC component, and can be connected via bonding wires to the IC component and the terminals on the component side of the carrier substrate. Since the carrier part with the IC component can be mounted on the component side of the carrier substrate in such a way that, except for a small clearance, it adjoins the connecting circuit traces, the area between the connecting circuit traces and the IC component, not utilized in the related art, is also utilized.

According to the present invention the discrete resistors necessary to suppress interference signals can be mounted directly on the top side of the carrier part. Since the electrical interface connection of the resistors is effected on the carrier part, the additional space requirement for the resistors and their wiring is eliminated on the carrier substrate of the module.

Furthermore, the present invention provide a silicon substrate as the carrier part, upon which printed circuit traces and resistors can be manufactured with great precision.

According to the present invention, the carrier part can be provided as a ceramic substrate, and particularly as a ceramic multilayer substrate, since this permits circuit-trace connections and individual components to be arranged relatively simply on the different layers of the carrier part. Due to this, the density of the printed circuit traces and the number of wiring layers on the carrier substrate can be reduced considerably.

The present invention also provide that the resistors, provided to suppress interference, are produced in thin-film or thick-film technology on the ceramic carrier part. Since such structures can be produced to be very small, the space requirement for the resistors can hereby be considerably reduced.

According to the present invention, the ceramic multi-layer substrate components are provided with capacitive or inductive functions which can be integrated in the ceramic substrate in a known manner.

According to the present invention, the carrier part with the IC component can be simply pasted onto the carrier substrate of the module. In so doing, a heat-conducting adhesive agent can be used for improved dissipation of the heat produced by the IC component.

BRIEF DESCRIPTION OF THE DRAWINGS

The FIGURE shows a simplified cross-section not to scale, of a first exemplary embodiment of the multichip module of the present invention, with the pasted-on carrier part and a single IC component.

DETAILED DESCRIPTION

The FIGURE shows a first exemplary embodiment of the multichip module of the present invention. In the exemplary embodiment shown here, carrier substrate 2 of multichip module 1 is made of a multilayer printed circuit board. On top side 3 of module 1, provided as the component side, are various components 7 which are interconnected in a known manner by way of printed circuit traces 9 on the top side and the inner layers of printed-circuit board 2, and by way of vias. The electrical connections of the circuit arrangement provided on the multichip module are led by way of vias 6 to bottom side 4 of printed-circuit board 2, and are joined there to solder contacts 5 in the form of solder bumps. Multichip module 1 is mounted with solder bumps 5 on correspondingly aligned contact pads of a card cage, not shown, and is soldered to them using the reflow soldering method.

Provided on top side 3 of multilayer printed-circuit board 2, in addition to components 7, are a plurality of IC components 30 (integrated circuits), of which only one is shown in the figure for the sake of simplicity. IC component 30 is mounted on a carrier part 20 (multilayer ceramic) using the chip-on-board method. Carrier part 20 is in turn mounted on top side 3 of printed-circuit board 2. In the exemplary embodiment shown, carrier part 20 is a ceramic multilayer substrate (multilayer ceramic) and is made of a plurality of insulating ceramic layers, between which printed circuit traces are provided, that are interconnected by way of vias. In typical manner, the structure sizes of the printed circuit traces and vias on the ceramic multilayer substrate are smaller than the corresponding structure sizes on printed-circuit board 2. However, the use of different carrier substrates for the carrier part, such as the use of a silicon substrate or a simple ceramic board, is also conceivable.

IC component 30 shown in FIG. 1 is joined, by way of an adhesive layer 31, to multilayer ceramic 20, which in turn is joined to printed-circuit board 2 by way of an adhesive layer 11 made of a heat-conducting adhesive. On one hand, the base area of multilayer ceramic 20 is larger than the base area of the IC component, but on the other hand, is small enough that multilayer ceramic 20 can be pasted onto printed-circuit board 2 between terminals 10 of printed circuit traces 9 in the area provided for mounting an IC component. Terminal pads 21 and terminal pads 22 in the form of bonding pads are provided on the portion of top surface 25 of multilayer ceramic 20 not covered by IC component 30. Terminal pads 21 are connected to the terminals of IC component 30 by way of bonding wires 23. On the other hand, terminal pads 22 are connected to terminals 10 of printed circuit traces 9 by way of further bonding wires 12. Furthermore, discrete resistors 24, produced using thin-film technology, are applied on top surface 25 between first terminal pads 21 and second terminal pads 22 to suppress electromagnetic interference. Resistors 24 can be connected directly to terminal pads 21 and 22, or by way of further printed circuit traces provided on top surface 25. Alternatively, printed circuit traces and resistors can also be produced using thick-film technology. Furthermore, it is possible to provide printed circuit traces and resistors on top side 25 below the IC component, as well. This is particularly advantageous when only a single-layer ceramic board is used as carrier part 20. The IC component is then mounted, separated by an electrically insulating adhesive agent, on top side 25 having the printed circuit traces and resistors. If carrier part 20 is a multilayer ceramic, as in the example shown in the figure, then printed circuit traces are also provided on the inner layers of multilayer ceramic 20, which are connected to the printed circuit traces and terminal pads 21,22 on top side 25 by way of vias. Thus, a large portion of the electrical conductor connections between IC component 30 and resistors 24 is provided on top side 25 and the inner layers of multilayer ceramic 20. Therefore, the density of printed circuit traces and the number of layers can be reduced on printed-circuit board 2.

Besides the printed circuit traces and discrete resistors 24, in the exemplary embodiment shown here, still further capacitive components 28 and inductive components 27 are provided as integrated components on top side 25 or one of the inner layers of multilayer ceramic 20. In this context, capacitive components 28, such as capacitors, can be produced in a generally known manner over printed circuit traces used as electrodes which are applied so as to be flat on the individual layers and are separated by dielectric intervening layers. Inductive components such as coils can be produced by individual printed circuit traces having suitable length and shape.

Due to the fine-structured printed circuit traces, the placement of resistors 24, capacitive components 27 and inductive components 28 on top side 25 and on the inner layers of multilayer ceramic 20, as well as the mounting of terminal pads 21,22 on the portion of top side 25 not covered by component 30, the multichip module can be manufactured smaller and more cost-effectively than previously.

What is claimed is:

1. A multichip module, comprising:

electrical through lines;

a carrier substrate having a component side and a bottom side, wherein the electrical through-lines connect the component side and the bottom side, wherein the electrical through-lines are joined to solder contacts arranged on the bottom side of the carrier substrate;

at least one IC component mounted on the component side of the carrier substrate, wherein a base area of the carrier part is larger than a base area of the each of the at least one IC component;

an electrically conductive interconnect;

at least one other electronic component mounted on the component side of the carrier substrate, wherein the at least one IC component and the at least one other electronic component are interconnected by the electrically conductive interconnect; and a carrier part arranged between each of the at least one IC component and the carrier substrate, wherein the carrier part includes at least one conducting element electrically connected to the each of the at least one IC component via first terminal pads arranged on the carrier part, wherein the at least one conducting element is electrically connected to terminals on the carrier substrate via second terminal pads arranged on the carrier part, wherein the first terminal pads and the second terminal pads are arranged on a top side of the carrier part not covered by each of the at least one IC component, wherein the first terminal pads are electrically connected to the each of the at least one IC component via bonding wires, wherein the second terminal pads are electrically connected to the terminal on the carrier substrate via additional bonding wires, and wherein the at least one conducting element includes at least one of a printed circuit trace and a component, wherein the component includes at least one discrete resistor, for suppressing electromagnetic interference, arranged on the top side of the carrier part, and wherein the at least one discrete resistor is electrically connected to the first terminal pads and the second terminal pads.

2. The multichip module according to claim 1, wherein the carrier part includes a silicon substrate.

3. The multichip module according to claim 1, wherein the carrier part includes a ceramic substrate.

4. The multichip module according to claim 1, wherein the carrier part includes a ceramic, multilayer substrate, wherein the at least one conducting element includes a plurality of conducting elements provided in a plurality of layers of the carrier part, wherein each of the plurality of layers is separated by an insulating ceramic layer, and wherein the plurality of conducting elements on separate layers are electoconductively connected by vias in the insulating ceramic layer.

5. The multichip module according to claim 3, wherein the printed circuit trace and the at least one discrete resistor are applied using one of thin-film technology and thick-film technology.

6. The multichip module according to claim 4, wherein the plurality of conducting elements include one of an inductive component and a capacitive component, and wherein the one of the inductive component and the capacitive component is provided on one of a top side of the carrier part and an inner layer of the carrier part.

7. The multichip module according to claim 1, wherein the carrier part is pasted onto the carrier substrate.

8. The multichip module according to claim 7, wherein the carrier part is pasted onto the carrier substrate using a heat-conducting adhesive.

* * * * *

UNITED STATES PATENT AND TRADEMARK OFFICE
CERTIFICATE OF CORRECTION

PATENT NO. : 5,953,213
DATED : September 14, 1999
INVENTOR(S) : Dieter NAPIERALA It is certified that error appears in the above-identified patent and that said Letters Patent is hereby corrected as shown below:

Front page, Abstract, line 57, change "being" to --are--;

Column 2, line 25, after "invention" insert --,--;

Column 2, line 32, change "provide" to --provides--;

Column 2, line 43, change "provide" to --provides--; and

Column 3, line 34, change "FIG. 1" to --the figure--.

Signed and Sealed this

Tenth Day of April, 2001

Attest:

NICHOLAS P. GODICI

*Attesting Officer*    Acting Director of the United States Patent and Trademark Office